United States Patent
Nakayama et al.

(10) Patent No.: US 11,676,661 B2
(45) Date of Patent: Jun. 13, 2023

(54) STORAGE DEVICE

(71) Applicant: KIOXIA CORPORATION, Tokyo (JP)

(72) Inventors: Masahiko Nakayama, Kuwana Mie (JP); Kazumasa Sunouchi, Yokohama Kanagawa (JP); Jyunichi Ozeki, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 3 days.

(21) Appl. No.: 17/459,467

(22) Filed: Aug. 27, 2021

(65) Prior Publication Data
US 2022/0293171 A1 Sep. 15, 2022

(30) Foreign Application Priority Data

Mar. 11, 2021 (JP) .............................. JP2021-039536

(51) Int. Cl.
*G11C 11/00* (2006.01)
*G11C 13/00* (2006.01)
*G11C 5/06* (2006.01)

(52) U.S. Cl.
CPC .............. *G11C 13/004* (2013.01); *G11C 5/06* (2013.01); *G11C 13/0026* (2013.01); *G11C 13/0028* (2013.01); *G11C 13/0038* (2013.01)

(58) Field of Classification Search
CPC ..... G11C 13/004; G11C 5/06; G11C 13/0026; G11C 13/0028
USPC ........................................................ 365/148
See application file for complete search history.

(56) References Cited

U.S. PATENT DOCUMENTS

| | | | |
|---|---|---|---|
| 7,042,757 B2 | 5/2006 | Perner | |
| 8,792,266 B2 | 7/2014 | Takashima | |
| 8,817,540 B2 | 8/2014 | Lee et al. | |
| 9,812,499 B1 | 11/2017 | Satoh et al. | |
| 10,242,743 B2 | 3/2019 | Hsu | |
| 2005/0047218 A1* | 3/2005 | Kirihata | G11C 11/405 365/189.07 |

(Continued)

FOREIGN PATENT DOCUMENTS

| | | |
|---|---|---|
| JP | 5354391 B2 | 11/2013 |
| TW | 200636726 A | 10/2006 |

OTHER PUBLICATIONS

US 9,953,691 B2, 04/2018, Noguchi et al. (withdrawn)

(Continued)

*Primary Examiner* — Vu A Le
(74) *Attorney, Agent, or Firm* — Kim & Stewart LLP

(57) ABSTRACT

According to one embodiment, a storage device includes first wirings extending in a first direction and second wirings extending in a second direction. A memory cells are connected between the first wirings and the second wirings and include a variable resistance memory element. A first drive circuit is provided for supplying voltages to the first wirings, and a second drive circuit is provided for supplying voltages to the second wirings. The first drive circuit applies a first voltage to a selected first wiring, the second drive circuit applies a second voltage to a selected second wiring. A voltage between the second voltage and one-half of the sum of the first and second voltages is applied to a non-selected first wiring, and a voltage between the first voltage and one-half of the sum of the first and second voltages is applied to a non-selected second wiring.

20 Claims, 5 Drawing Sheets

(56) References Cited

U.S. PATENT DOCUMENTS

2009/0052225 A1    2/2009  Morimoto
2018/0061481 A1*   3/2018  Kawamura ............. F21S 41/43

OTHER PUBLICATIONS

An Chen, "A Highly Efficient and Scalable Model for Crossbar Arrays with Nonlinear Selectors", IBM Research Division, IEEE, 2018, 4 pages, San Jose, CA.

* cited by examiner

STORAGE DEVICE

CROSS-REFERENCE TO RELATED APPLICATION

This application is based upon and claims the benefit of priority from Japanese Patent Application No. 2021-039536, filed Mar. 11, 2021, the entire contents of which are incorporated herein by reference.

FIELD

Embodiments described herein relate generally to a storage device.

BACKGROUND

Storage devices in which variable resistance memory elements, such as magnetoresistance effect elements or the like, are integrated on a semiconductor substrate have been proposed.

DETAILED DESCRIPTION

Embodiments provide a storage device capable of reducing a leakage current.

In general, according to one embodiment, a storage device includes a plurality of first wirings extending in a first direction and a plurality of second wirings extending in a second direction intersecting the first direction. A plurality of memory cells are respectively connected between the plurality of first wirings and the plurality of second wirings. Each memory cell includes a variable resistance memory element. A first drive circuit is provided for supplying voltages to the plurality of first wirings. A second drive circuit is provided for supplying voltages to the plurality of second wirings. The first drive circuit applies a first voltage V1 to a selected first wiring connected to a selected memory cell. The second drive circuit applies a second voltage V2 (which is lower than the voltage V1) to a selected second wiring connected to the selected memory cell. The first drive circuit applies a voltage between (V1+V2)/2 and V2 to a non-selected first wiring other than the selected first wiring. The second drive circuit applies a voltage between V1 and (V1+V2)/2 to a non-selected second wiring other than the selected second wiring.

Hereinafter, certain example embodiments will be described with reference to the drawings.

First Embodiment

Figure 1:
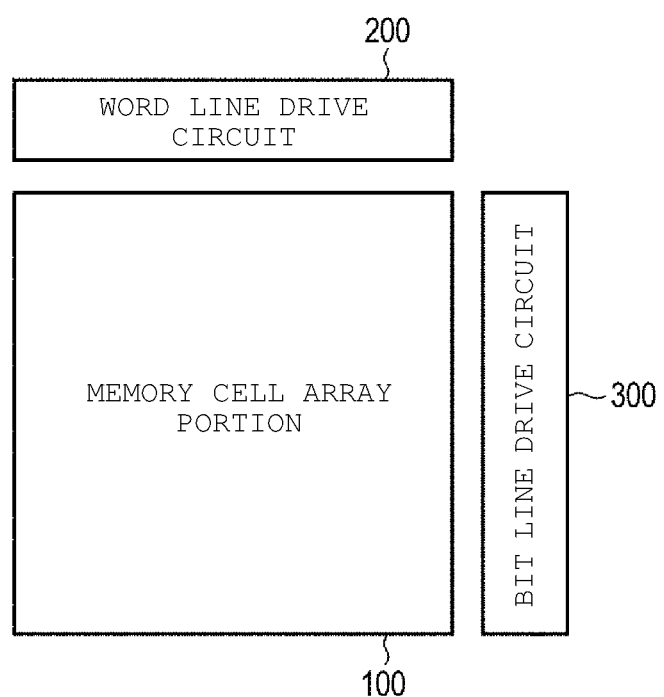
FIG. 1 is a block diagram illustrating an overall schematic layout configuration of a storage device according to a first embodiment.

FIG. 1 is a block diagram illustrating an overall schematic configuration of a non-volatile storage device according to a first embodiment. In the following description, a magnetic storage device will be described as an example of a non-volatile storage device, but the present disclosure is not limited thereto.

The magnetic storage device of the first embodiment includes a memory cell array portion 100, a word line (WL) drive circuit 200 (also referred to as a first drive circuit 200), and a bit line (BL) drive circuit 300 (also referred to as a second drive circuit 300).

Figure 2A:
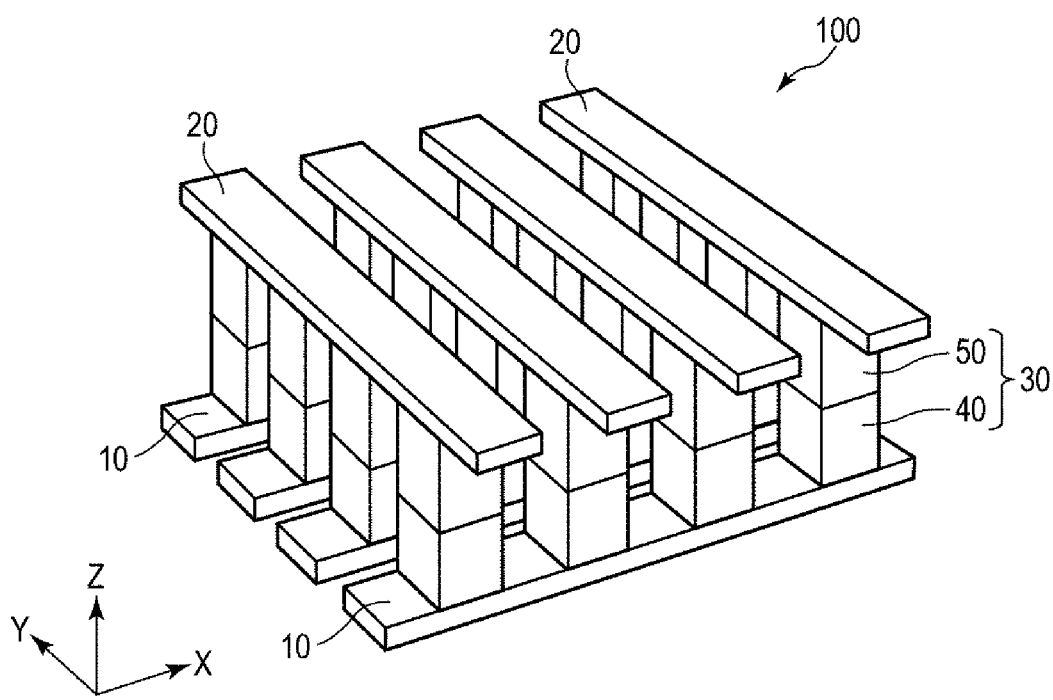
FIG. 2A is a perspective view schematically illustrating a memory cell array portion of a storage device according to a first embodiment.

FIG. 2A is a perspective view schematically illustrating a configuration of the memory cell array portion 100.

The memory cell array portion 100 is provided on a base area including a semiconductor substrate. The memory cell array portion 100 includes a plurality of word lines 10 (first wirings 10), a plurality of bit lines (20 (second wirings 20) intersecting the plurality of word lines 10. A plurality of memory cells 30 are between the plurality of word lines 10 and the plurality of bit lines 20. Each memory cell 30 is at an intersection (or crossing point) of a word line 10 and a bit line 20.

A word line 10 and a bit line 20 supply a predetermined signal to a memory cell 30 when writing or reading of data with respect to a particular memory cell 30 is being performed. In FIG. 2A, while the word lines 10 are located on a lower layer side and the bit lines 20 are located on an upper layer side, the word lines 10 may be located on the upper layer side and the bit lines 20 may be located on the lower layer side.

Each memory cell 30 includes a magnetoresistance effect element 40 (which can also be referred to as a non-volatile variable resistance memory element) and a selector 50 (also referred to as a switching element 50). The magnetoresistance effect element 40 and the selector 50 are connected in series between the word line 10 and the bit line 20.

Figure 2B:
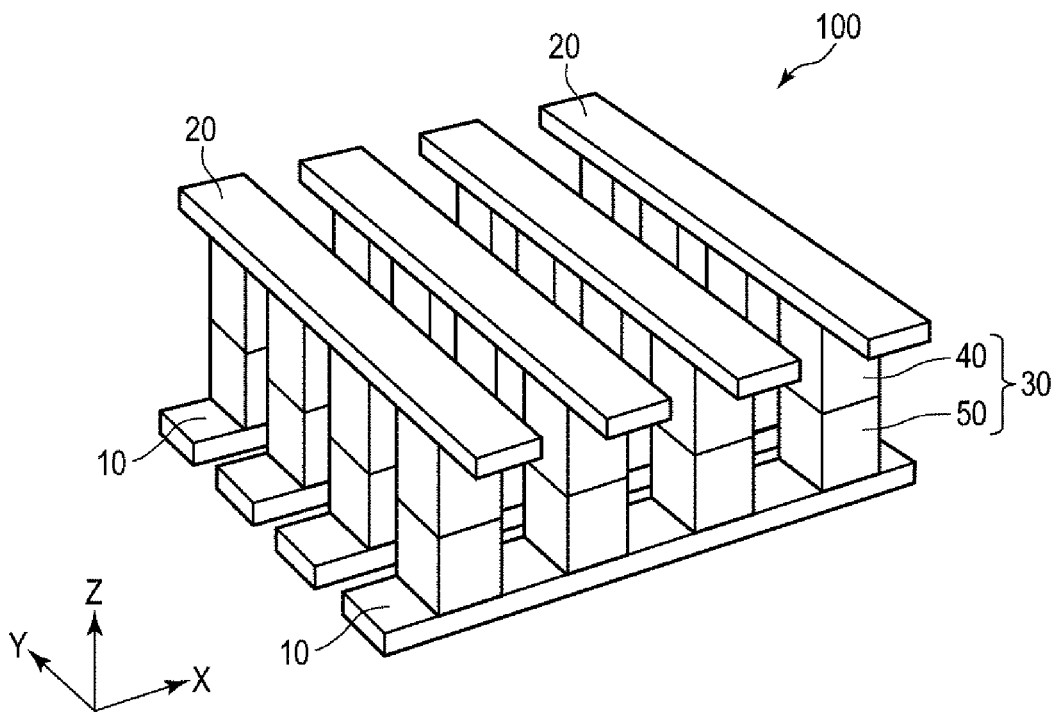
FIG. 2B is a perspective view schematically illustrating a modification of a memory cell array portion of a storage device according to a first embodiment.

In FIG. 2A, the magnetoresistance effect element 40 is located on a lower layer side, and the selector 50 is located on an upper layer side, but as illustrated in the modification example of FIG. 2B, the magnetoresistance effect element 40 may be located on the upper layer side and the selector 50 may be located on the lower layer side in other embodiments.

Figure 3:
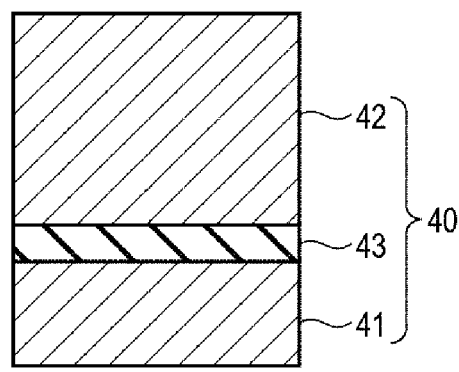
FIG. 3 is a cross-sectional view schematically illustrating a configuration of a magnetoresistance effect element in a storage device according to a first embodiment.

FIG. 3 is a cross-sectional view schematically illustrating a configuration of the magnetoresistance effect element 40.

In the present embodiment, a magnetic tunnel junction (MTJ) element is used as the magnetoresistance effect element 40. The magnetoresistance effect element 40 includes a storage layer 41 (also referred to as a first magnetic layer), a reference layer 42 (also referred to as a second magnetic layer), and a tunnel barrier layer 43 (also referred to as a non-magnetic layer).

The storage layer 41 is a ferromagnetic layer having a variable magnetization direction. In this context, a variable magnetization direction of a layer refers to the capability of a magnetization direction of the layer to change when a predetermined write current or the like is applied across the layer. The storage layer 41 is formed of, for example, a CoFeB layer comprising cobalt (Co), iron (Fe) and boron (B).

The reference layer 42 is a ferromagnetic layer having a fixed magnetization direction. In this context, a fixed magnetization direction of a layer refers to the capability of the magnetization direction of the layer to remain constant (fixed) even when the predetermined write current or the like is applied across the layer. For example, the reference layer 42 is formed of a CoFeB layer comprising cobalt (Co), iron (Fe) and boron (B), cobalt (Co), and a superlattice layer of an element selected from a group of elements including platinum (Pt), nickel (Ni) and palladium (Pd).

The tunnel barrier layer 43 is an insulating layer provided between the storage layer 41 and the reference layer 42, and is formed of, for example, a magnesium oxide (MgO).

When the magnetization direction of the storage layer 41 is parallel to the magnetization direction of the reference layer 42, the magnetoresistance effect element 40 is in a low resistance state (resistance is relatively low). When the magnetization direction of the storage layer 41 is anti-parallel to the magnetization direction of the reference layer 42, the magnetoresistance effect element 40 is in a high resistance state (resistance is relatively high). Therefore, the magnetoresistance effect element 40 can store binary data according to its resistance states (a low resistance state and a high resistance state indicating respective binary values). The magnetoresistance effect element 40 can be set to the low resistance state or the high resistance state according to a direction of the write current applied thereto.

The magnetoresistance effect element 40 of the present embodiment is a Spin Transfer Torque (STT) type magnetoresistance effect element, and has perpendicular magnetization. That is, the magnetization direction of the storage layer 41 is orthogonal to a film surface of the storage layer 41. The magnetization direction of the reference layer 42 is orthogonal to a film surface of the reference layer 42.

While the magnetoresistance effect element 40 illustrated in FIG. 3 has a bottom-free type structure in which the storage layer 41 is located on the lower layer side and the reference layer 42 is located on the upper layer side, the present embodiment may instead use a magnetoresistance effect element having a top-free type structure in which the storage layer 41 is located on the upper layer side and the reference layer 42 is located on the lower layer side.

Figure 4:
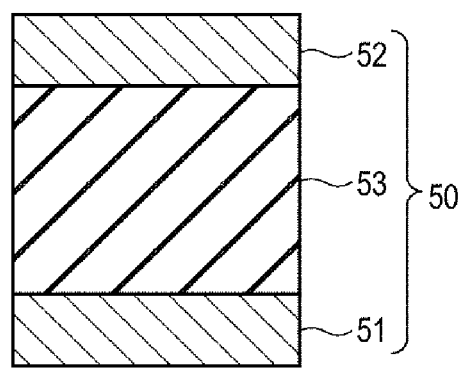
FIG. 4 is a cross-sectional view schematically illustrating a configuration of a selector in a storage device according to a first embodiment.

FIG. 4 is a cross-sectional view schematically illustrating a configuration of the selector 50.

The selector 50 includes a lower electrode 51, an upper electrode 52, and a selector material layer 53 (also referred to as switching material layer 53) provided between the lower electrode 51 and the upper electrode 52. The selector 50 is a two-terminal type switching element (switch) having a nonlinear current-voltage characteristic. When a voltage applied between the two terminals is less than a threshold voltage, the selector 50 is in a high resistance state (e.g., in an electrically non-conductive state). On the other hand, when the voltage applied between the two terminals is equal to or higher than the threshold voltage, the selector 50 is in a low resistance state (e.g., in an electrically conductive state). Substantially the same effect can also be obtained by utilizing a two-terminal type switching element having a linear current-voltage characteristic.

Figure 5:
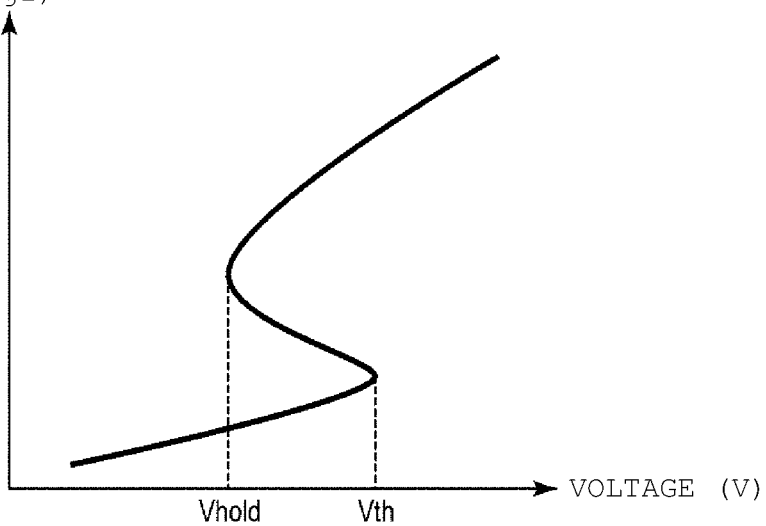
FIG. 5 is a diagram schematically illustrating current-voltage (I-V) characteristics of a selector in a storage device according to a first embodiment.

FIG. 5 is a diagram schematically illustrating an example of the current-voltage (I-V) characteristics of the selector 50. When a voltage between the two terminals of selector 50 is being ramped upward and reaches a threshold voltage Vth, the voltage between the two terminals drops to a hold voltage Vhold, and the current significantly increases.

By applying a voltage equal to or higher than a predetermined voltage between the first wiring 10 and the second wiring 20, the selector 50 is turned on (in the conductive state), thereby making it possible to perform writing or reading on the magnetoresistance effect element 40 connected in series to the selector 50.

Figure 6:
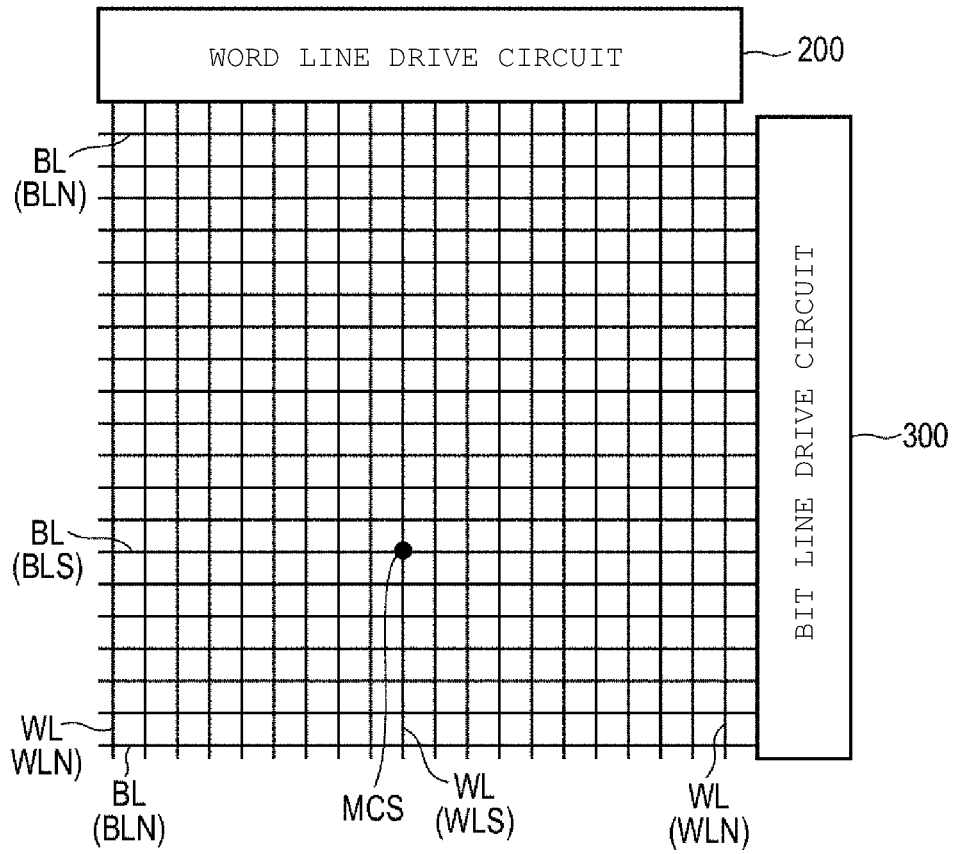
FIG. 6 is a diagram illustrating aspects related to an operation of a storage device according to a first embodiment.

Next, an operation of the storage device according to the first embodiment will be described with reference to FIG. 6. Here, a write operation will be described as an example operation.

When the write operation is performed, the word line drive circuit 200 supplies a predetermined voltage to a word line WL (which corresponds to a word line 10 in FIGS. 2A and 2B), and the bit line drive circuit 300 supplies a predetermined voltage to a bit line BL (which corresponds to a bit line 20 in FIGS. 2A and 2B).

Specifically, the word line drive circuit 200 applies a voltage V1 to a selected word line WLS connected to a selected memory cell MCS. The bit line drive circuit 300 applies a voltage V2 (which is lower than the voltage V1) to the bit line BLS (selected bit line BLS) connected to the selected memory cell MCS.

The word line drive circuit 200 applies a voltage between (V1+V2)/2 and V2 to non-selected word lines WLN (word lines WL other than the selected word line(s) WLS). The bit line drive circuit 300 applies a voltage between V1 and (V1+V2)/2 to non-selected bit lines BLN (bit lines BL other than the selected bit line(s) BLS).

More specifically, the word line drive circuit 200 applies a voltage (V1+V2)/2−Voffseta to the non-selected word lines WLN. The bit line drive circuit 300 applies a voltage (V1+V2)/2+Voffsetb to the non-selected bit lines BLN. However, both Voffseta and Voffsetb are positive values in this context.

In this manner, the voltage applied from the word line drive circuit 200 to the word lines WL is set, and the voltage applied from the bit line drive circuit 300 to the bit lines BL is set, thereby making it possible to perform the write operation in which a write voltage (or write current) is appropriately controlled.

Here, in order to simplify the description, it is assumed that the voltage output from the word line drive circuit 200 is applied to the memory cell without a voltage drop along the word line WL or the like, and the voltage output from the bit line drive circuit 300 is applied to the memory cell without a voltage drop along the bit line BL or the like.

In a standard write operation, the voltage V1 is applied to the selected word line WLS and the voltage V2 is applied to the selected bit line BLS in the same manner as that of the case of the above-described embodiment. However, the voltage (V1+V2)/2 is applied to both of the non-selected word line WLN and the non-selected bit line BLN in the standard write operation unlike in the above-described embodiment. Therefore, a voltage having a magnitude of (V1−V2) is applied to the selected memory cell MCS connected between the selected word line WLS and the selected bit line BLS in the standard write operation. A voltage having a magnitude of (V1−V2)/2 is applied to the memory cells connected between a selected word line WLS and a non-selected bit line BLN and also the memory cells connected between a non-selected word line WLN and a selected bit line BLS. In the following description, these type of memory cells (a memory cell connected to a selected word line WLS or selected bit line BLS, but not both a selected word line WLS and selected bit line BLS) may be referred to as "semi-selected memory cells" or partially selected memory cells.

As can be seen from the above-description, in a standard write operation, a voltage of ½ of the voltage applied to the selected memory cell is applied to the semi-selected memory cells. Therefore, a leakage current may flow in the semi-selected memory cell, and an appropriate write operation may be hindered.

On the other hand, in the first embodiment, a voltage of V1−{(V1+V2)/2+Voffsetb}, that is, a voltage of (V1−V2)/2−Voffsetb is applied to the semi-selected memory cells between a selected word line WLS and a non-selected bit line BLN. A voltage of {(V1+V2)/2−Voffseta}−V2, that is, a voltage of (V1−V2)/2−Voffseta is applied to the semi-selected memory cells between a non-selected word line WLN and a selected bit line BLS. Therefore, in any case, a voltage lower than a voltage of ½ of the voltage (V1−V2), which is applied to the selected memory cell, will be applied to the semi-selected memory cells.

As described above, in the first embodiment, the magnitude of the voltage applied to the semi-selected memory cell can be reduced, thus the leakage current flowing through the semi-selected memory cell can be reduced. Therefore, in the first embodiment, the leakage current can be better controlled such that overall current consumption can be reduced.

It is desirable to set the voltage applied to the non-selected word line WLN and the voltage applied to the non-selected bit line BLN, so that the voltage lower than the voltage of ½ of the voltage (V1−V2) applied to the selected memory cell is also applied to the non-selected memory cell connected between the non-selected word line WLN and the non-selected bit line BLN.

Second Embodiment

Basic matters are the same for the second embodiment as those of the first embodiment unless otherwise noted, and the description of the matters already described in the first embodiment may be omitted.

Figure 7:
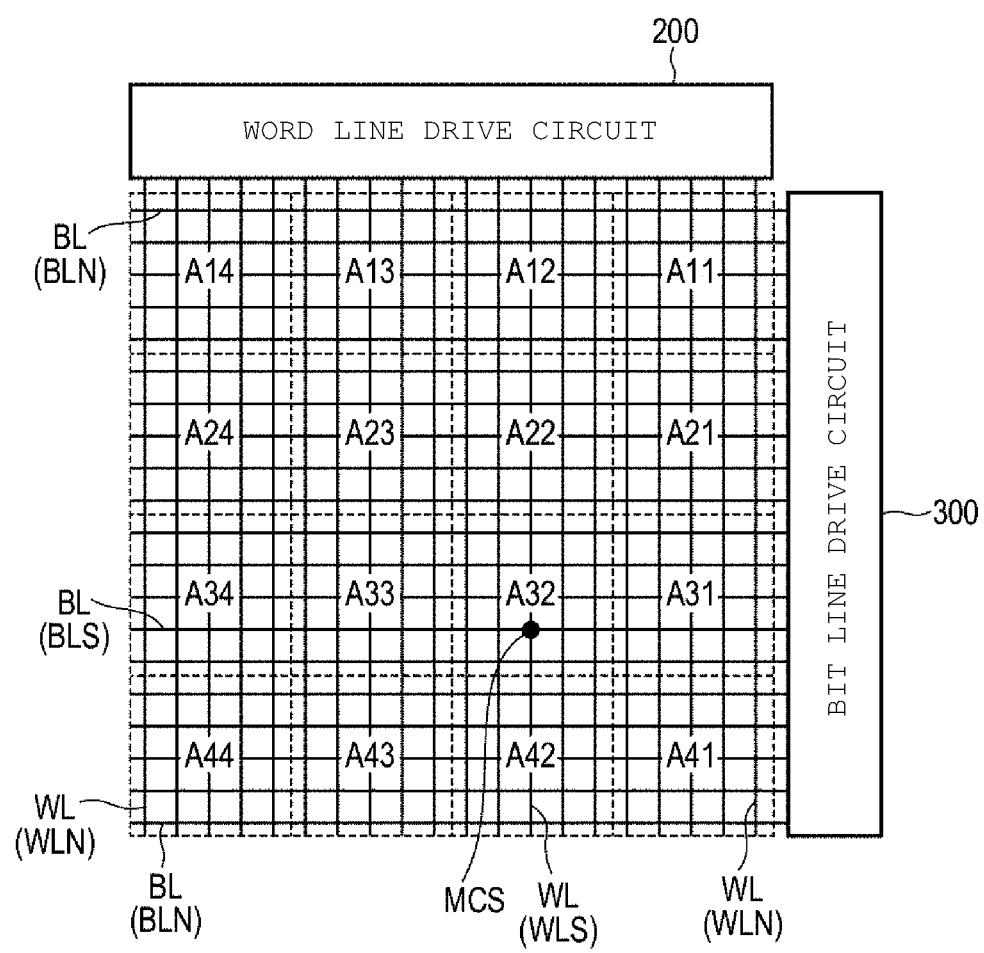
FIG. 7 is a diagram illustrating aspects related to an operation of a storage device according to a second embodiment and according to a third embodiment.

FIG. 7 is a diagram illustrating an operation of a storage device according to the second embodiment. A write operation will again be described as an example.

In the second embodiment, like in the first embodiment, the word line drive circuit 200 applies the voltage V1 to the selected word line WLS, and the bit line drive circuit 300 applies the voltage V2 (which is lower than the voltage V1) to the selected bit line BLS.

The word line drive circuit 200 again applies a voltage between (V1+V2)/2 and V2 to the non-selected word lines WLN, and the bit line drive circuit 300 applies a voltage between V1 and (V1+V2)/2 to the non-selected bit lines BLN.

More specifically, in the same manner as that of the first embodiment, the word line drive circuit 200 applies the voltage (V1+V2)/2−Voffseta to the non-selected word lines WLN, and the bit line drive circuit 300 applies the voltage (V1+V2)/2+Voffsetb to the non-selected bit lines BLN.

While the value of Voffseta and the value of Voffsetb are fixed values in the first embodiment, in the second embodiment, the value of Voffseta changes according to the location of the non-selected word line WLN (more particularly, the position of the non-selected word line WLN along the direction in which the word lines WL are spaced apart from each other), and the value of Voffsetb changes according to the location of the non-selected bit line BLN (more particularly, the position of the bit line BLN along the direction in which the bit lines BL are spaced apart from each other). That is, in the second embodiment, the voltage applied to the non-selected word line WLN is set according to the location of the non-selected word line WLN within the array, and the voltage applied to the non-selected bit line BLN is set according to the location of the non-selected bit line BLN within the array.

In general, the value of Voffseta for the non-selected word lines WLN located farther from the bit line drive circuit 300 is set to be smaller than the value of Voffseta for the non-selected word lines WLN located closer to the bit line drive circuit 300. The value of Voffsetb for non-selected bit lines BLN located farther from the word line drive circuit 200 is set to be smaller than the value of Voffsetb for the non-selected bit lines BLN located closer to the word line drive circuit 200.

Normally, the voltage output from the word line drive circuit 200 decreases as a distance from the word line drive circuit 200 increases due to a resistance or the like of the word line WL. That is, as the distance from the word line drive circuit 200 increases, the voltage drop amount due to the word line WL increases. Therefore, in the second embodiment, as the distance from the word line drive circuit 200 increases, the value of Voffsetb decreases. Likewise, as a distance from the bit line drive circuit 300 increases for the non-selected word lines WLN, the value of Voffseta decreases.

By the voltage application operation of the second embodiment, it is possible to reduce and also uniformize the voltage applied to the semi-selected memory cells, and thus it is possible to reduce and uniformize the leakage current of the semi-selected memory cells.

In the example illustrated in FIG. 7, the word lines WL are grouped into different groups. Specifically, the word lines WL are grouped into a first group consisting of sub-array areas A11, A21, A31, A41, a second group consisting of sub-array areas A12, A22, A32, A42, a third group consisting of sub-array areas A13, A23, A33, A43, and a fourth group consisting of sub-array areas A14, A24, A34, A44. The voltage applied to the non-selected word line WLN is a different value for each group of word lines WL.

In the same manner, the bit lines BL are grouped into different groups. Specifically, the bit lines BL are grouped into a first group consisting of sub-array areas A11, A12, A13, A14, a second group consisting of sub-array areas A21, A22, A23, A24, a third group consisting of sub-array areas A31, A32, A33, A34, and a fourth group consisting of sub-array areas A41, A42, A43, A44. The voltage applied to the non-selected bit line BLN is set to a different value for each group of bit lines BL.

More specifically, the value of Voffseta with respect to the non-selected word line WLN in a group of word lines WL far from the bit line drive circuit 300 is smaller than the value of Voffseta with respect to the non-selected word line WLN in a group of word lines WL close to the bit line drive circuit 300. The value of Voffsetb with respect to the non-selected bit line BLN in a group of bit lines BL far from the word line drive circuit 200 is smaller than the value of Voffsetb with respect to the non-selected bit line BLN in a group of bit lines BL close to the word line drive circuit 200.

In the second embodiment, in the same manner as that of the first embodiment, a voltage lower than the voltage of ½ of the voltage (V1−V2) applied to the selected memory cells is applied to the semi-selected memory cell. Therefore, in the second embodiment, the magnitude of the voltage applied to the semi-selected memory cells can be reduced, such that the leakage current flowing through the semi-selected memory cell can be reduced. As a result, the leakage current can be better controlled such that the overall current consumption can be reduced.

In the second embodiment, the voltage applied to the non-selected word lines WLN is set according to the location of the non-selected word line WLN, and the voltage applied to the non-selected bit lines BLN is set according to the location of the non-selected bit line BLN. Accordingly, it is possible to reduce and better uniformize the leakage current of the semi-selected memory cells.

Third Embodiment

Basic matters are the same for the third embodiment as those of the first embodiment unless otherwise noted, and the description of the matters already described in the first embodiment may be omitted.

FIG. 7 is a diagram also illustrating an operation of a storage device according to the third embodiment. In the third embodiment, a write operation will be described as an example operation.

In the third embodiment, like in the first embodiment, the word line drive circuit 200 applies the voltage V1 to the selected word line WLS, and the bit line drive circuit 300 applies the voltage V2 (which is lower than the voltage V1) to the selected bit line BLS.

The word line drive circuit 200 again applies a voltage between (V1+V2)/2 and V2 to the non-selected word lines WLN, and the bit line drive circuit 300 applies a voltage between V1 and (V1+V2)/2 to the non-selected bit lines BLN.

More specifically, in the same manner as that of the first embodiment, the word line drive circuit 200 applies the voltage (V1+V2)/2−Voffseta to the non-selected word lines WLN, and the bit line drive circuit 300 applies the voltage (V1+V2)/2+Voffsetb to the non-selected bit lines BLN.

In the first embodiment, while the voltage V1 applied to the selected word line WLS and the voltage V2 applied to the selected bit line BLS are both fixed values, in the third embodiment, the value of the voltage V1 and the value of the voltage V2 are changed (set) according to the location of the selected memory cell MCS.

In the third embodiment, the voltage applied to the non-selected word line WLN and the voltage applied to the non-selected bit line BLN are also set according to the location of the selected memory cell MCS. Essentially, the voltage applied to the non-selected word lines WLN is constant regardless of the location of the non-selected word line WLN within the array, and likewise the voltage applied to the non-selected bit lines BLN is constant regardless of the location of the non-selected bit line BLN within the array. However, the voltage applied to the non-selected word lines WLN and the voltage applied to the non-selected bit line BLN do change according to the location of the selected memory cell MCS within the array, but are values are constant over the whole array area (that is, the same Voffseta or Voffsetb is utilized for every non-selected word line WLN or non-selected bit line BLN regardless of array location of the non-selected word line WLN or non-selected bit line BLN).

However, in some examples, the technique of the second embodiment may be combined with the third embodiment, such that the voltage applied to the non-selected word line WLN and the voltage applied to the non-selected bit line BLN may change according to the location of the non-selected word line WLN and the location of the non-selected bit line BLN in addition to any changes associated with variations set based on the location of the selected memory cell MCS within the array.

In the third embodiment, the value of the voltage V1 is higher when the location of the selected memory cell MCS is far from the word line drive circuit 200 than when the selected memory cell MCS is close to the word line drive circuit 200. Similarly, the value of the voltage V2 is lower when the location of the selected memory cell MCS is far from the bit line drive circuit 300 than when the location selected memory cell MCS is close to the bit line drive circuit 300.

More specifically, the value of Voffseta is greater when the location of the selected memory cell MCS is far from the bit line drive circuit 300 than when the location selected memory cell MCS is close to the bit line drive circuit 300. The value of Voffsetb is greater when the location of the selected memory cell MCS is far from the word line drive circuit 200 than when the location selected memory cell MCS is close to the word line drive circuit 200.

The voltage output from the word line drive circuit 200 decreases (drops) as the distance from the word line drive circuit 200 increases due to the resistance or the like of the word line WL. As the distance from the word line drive circuit 200 to the selected memory cell MCS increases, a voltage drop amount increases. Therefore, in the third embodiment, in consideration of this voltage drop amount, a voltage higher than a voltage to be originally applied from the selected word line WLS to the selected memory cell MCS is output from the selected word line drive circuit 200 to the selected word line WLS. That is, as the distance from the word line drive circuit 200 to the selected memory cell MCS increases, a higher voltage is output from the word line drive circuit 200 to the selected word line WLS. Accordingly, a voltage corresponding to the voltage to be originally applied can be applied from the selected word line WLS to the selected memory cell MCS.

In the same manner, as the distance from the bit line drive circuit 300 to the selected memory cell MCS increases, a lower voltage is output from the bit line drive circuit 300 to the selected bit line BLS. Accordingly, a voltage corresponding to a voltage to be originally applied can be applied from the selected bit line BLS to the selected memory cell MCS.

As described above, in the third embodiment, a voltage higher than the voltage to be originally applied to the selected the memory cell MCS from the selected word line WLS is applied to the selected word line WLS from the word line drive circuit 200. Therefore, in the third embodiment, the value of Voffsetb increases to prevent an increase in the voltage applied to the semi-selected memory cell. Since the voltage applied from the word line drive circuit 200 to the selected word line WLS changes according to the location of the selected memory cell MCS, the value of Voffsetb also changes according to the location of the selected memory cell MCS. That is, a voltage applied from the bit line drive circuit 300 to the non-selected bit line BLN changes according to the location of the selected memory cell MCS. The same also applies to a voltage applied from the bit line drive circuit 300 to the selected bit line BLS and a voltage applied from the word line drive circuit 200 to the non-selected word line WLN. By the above-described voltage application operation, it is possible to reduce and better uniformize the leakage current of the semi-selected memory cell.

In the example illustrated in FIG. 7, an array area in which the memory cells are disposed includes the plurality of sub-array areas A11 to A44, and the voltage applied to the non-selected word lines WLN and the voltage applied to the non-selected bit lines BLN are set according to locations of the selected memory cell MCS in the sub-array areas A11 to A44.

Specifically, the value of Voffseta is greater when the selected memory cell MCS is located in a sub-array area are far from the bit line drive circuit 300 (e.g., in one of the sub-array areas A14, A24, A34, A44) than when in a sub-array area close to the bit line drive circuit 300 (e.g., in one of the sub-array areas A11, A21, A31, A41). The value of Voffsetb is greater when the selected memory cell MCS is located in a sub-array area far from the word line drive circuit 200 (e.g., in sub-array area A44, A43, A42, A41) than when in a sub-array area close to the word line drive circuit 200 (e.g., in sub-array area A14, A13, A12, A11).

In the third embodiment as well, in the same manner as that of the first embodiment, a voltage lower than a voltage of ½ of the voltage (V1−V2) applied to the selected memory cell is applied to the semi-selected memory cells. Therefore, in the third embodiment, the magnitude of the voltage applied to the semi-selected memory cells can be reduced such that the leakage current flowing through the semi-selected memory cells can be reduced. As a result, the leakage current can be better controlled such that the overall current consumption can be reduced.

In the third embodiment, the voltage applied to the non-selected word lines WLN and the voltage applied to the non-selected bit lines BLN are set according to the location of the selected memory cell MCS, thereby making it possible to reduce and better uniformize the leakage current of the semi-selected memory cells.

While the write operation was described in the first to third embodiments, the same operation principles may also be applied to a read operation, and the similar effects can be obtained.

In the first to third embodiments, the magnetoresistance effect element was the variable resistance memory element, but in other examples other variable resistance memory element types such as a phase change memory (PCM) element or the like may also be used.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device, comprising:
a plurality of first wirings extending in a first direction;
a plurality of second wirings extending in a second direction intersecting the first direction;
a plurality of memory cells connected between the plurality of first wirings and the plurality of second wirings, each memory cell including a variable resistance memory element;
a first drive circuit for supplying a voltage to the plurality of first wirings; and
a second drive circuit for supplying a voltage to the plurality of second wirings, wherein
the first drive circuit applies a first voltage to a selected first wiring that is connected to a selected memory cell,
the second drive circuit applies a second voltage that is lower than the first voltage to a selected second wiring that is connected to the selected memory cell,
the first drive circuit applies a third voltage to a non-selected first wiring that is connected to a memory cell other than the selected memory cell, the third voltage being in a range between the second voltage and one-half of the sum of the first and second voltages, and
the second drive circuit applies a fourth voltage to a non-selected second wiring connected to a memory cell other than the selected memory cell, the fourth voltage being in a range between the first voltage and one-half of the sum of the first and second voltages.

2. The storage device according to claim 1, wherein
the third voltage is set according to a distance of the non-selected first wiring from the second drive circuit, and
the fourth voltage applied is set according to a distance of the non-selected second wiring from the first drive circuit.

3. The storage device according to claim 1, wherein
the third voltage is set to be one-half of the sum of the first and second voltages minus a first offset voltage,
the fourth voltage is set to be one-half of the sum of the first and second voltages plus a second offset voltage, and
the first and second offset voltages are positive values.

4. The storage device according to claim 3, wherein
a value of the first offset voltage fora non-selected first wiring that is located far from the second drive circuit is smaller than a value of the first offset voltage for a non-selected first wiring that is located closer to the second drive circuit, and
a value of the second offset voltage for a non-selected second wiring that is located far from the first drive circuit is smaller than a value of the second offset voltage for a non-selected second wiring located closer to the first drive circuit.

5. The storage device according to claim 1, wherein
the first wirings adjacent to each other in the second direction are grouped into different groups along the second direction,
voltages applied to non-selected first wirings are different for each group of the first wirings,
the second wirings adjacent to each other in the first direction are grouped into different groups along the first direction, and
voltages applied to non-selected second wirings are different for each group of the second wirings.

6. The storage device according to claim 5, wherein
the third voltage applied to the non-selected first wirings is set to be one-half of the sum of the first and second voltages minus a value Voffseta,
the fourth voltage applied to the non-selected second wirings is set to be one-half of the sum of the first and second voltages plus a value Voffsetb,
the value Voffseta and the value Voffsetb are positive values,
the value Voffseta for the non-selected first wirings in a group of first wirings far from the second drive circuit is smaller than the value Voffseta for the non-selected first wirings in a group of first wirings closer to the second drive circuit, and
the value Voffsetb for the non-selected second wirings in a group of second wirings far from the first drive circuit is smaller than the value Voffsetb for the non-selected second wirings in a group of second wirings closer to the first drive circuit.

7. The storage device according to claim 1, wherein
a value of the first voltage and a value of the second voltage are set according to a location of the selected memory cell, and
the third voltage and the fourth voltage are also set according to the location of the selected memory cell.

8. The storage device according to claim 7, wherein
the value of the first voltage is higher when a location of the selected memory cell is far from the first drive circuit than when the location of the selected memory cell is close to the first drive circuit, and
the value of the second voltage is lower when the location of the selected memory cell is far from the second drive circuit than when the location of the selected memory cell is close to the second drive circuit.

9. The storage device according to claim 8, wherein
the third voltage is set to be one-half of the sum of the first and second voltages minus a value Voffseta,
the fourth voltage is set to be one-half of the sum of the first and second voltages plus a value Voffsetb,
the value Voffseta and the value Voffsetb are positive values,
the value Voffseta is greater when a location of the selected memory cell is far from the second drive circuit than when the location selected memory cell is close to the second drive circuit, and
the value Voffsetb is greater when the location of the selected memory cell is far from the first drive circuit than when the location selected memory cell is close to the first drive circuit.

10. The storage device according to claim 1, wherein
the first voltage and the second voltage are set according to a location of the selected memory cell,
an array area in which the plurality of memory cells are disposed is divided into sub-array areas, and
the third voltage and the fourth voltage are set according to a location of the sub-array area in which the selected memory cell is located.

11. The storage device according to claim 10, wherein
the first voltage is higher when a location of the selected memory cell is far from the first drive circuit than when the location of the selected memory cell is close to the first drive circuit, and
the second voltage is lower when the location of the selected memory cell is far from the second drive circuit than when the location of the selected memory cell is close to the second drive circuit.

12. The storage device according to claim 11, wherein
the third voltage is set to be one-half of the sum of the first and second voltages minus a value Voffseta,
the fourth voltage is set to be one-half of the sum of the first and second voltages plus a value Voffsetb,
the value Voffseta and the value Voffsetb are positive values,
the value Voffseta is greater when a sub-array area in which the selected memory cell is located is far from the second drive circuit than when the sub-array area is close to the second drive circuit, and
the value Voffsetb is greater when the sub-array area in which the selected memory cell is located is far from the first drive circuit than when the sub-array area is close to the first drive circuit.

13. The storage device according to claim 1, wherein the variable resistance memory elements are magnetoresistance effect elements.

14. The storage device according to claim 1, wherein each of the plurality of memory cells further includes a switching element connected in series to the variable resistance memory element.

15. The storage device according to claim 14, wherein each switching element is a two-terminal type switching element having nonlinear current-voltage characteristics.

16. A storage device, comprising:
a plurality of word line wirings extending in a first direction;
a plurality of bit line wirings extending in a second direction intersecting the first direction;
a plurality of memory cells between the plurality of word line wirings and the plurality of bit line wirings, each memory cell including a variable resistance memory element;
a word line drive circuit for supplying a voltage to the plurality of word line wirings; and
a bit line drive circuit for supplying a voltage to the plurality of bit line wirings, wherein
the word line drive circuit applies a first voltage to a selected word line that is connected to a selected memory cell,
the bit line drive circuit applies a second voltage that is lower than the first voltage to a selected bit line that is connected to the selected memory cell,
the word line drive circuit applies a third voltage to a non-selected word line that is connected to a memory cell other than the selected memory cell, the third voltage being in a range between the second voltage and one-half of the sum of the first and second voltages, and
the bit line drive circuit applies a fourth voltage to a non-selected bit line connected to a memory cell other than the selected memory cell, the fourth voltage being in a range between the first voltage and one-half of the sum of the first and second voltages.

17. The storage device according to claim 16, wherein
the third voltage is set according to a distance in the second direction of the non-selected word line from the bit line drive circuit, and
the fourth voltage applied is set according to a distance in the first direction of the non-selected bit line from the word line drive circuit.

18. The storage device according to claim 16, wherein
the third voltage is set to be one-half of the sum of the first and second voltages minus a first offset voltage,
the fourth voltage is set to be one-half of the sum of the first and second voltages plus a second offset voltage,
the first and second offset voltages are positive values,
a value of the first offset voltage for a non-selected word line that is located far from the bit line drive circuit is smaller than a value of the first offset voltage for a non-selected word line that is located closer to the bit line drive circuit, and
a value of the second offset voltage for a non-selected bit line that is located far from the word line drive circuit is smaller than a value of the second offset voltage for a non-selected bit line located closer to the word line drive circuit.

19. The storage device according to claim 16, wherein the first voltage and the second voltage are set according to a location of the selected memory cell.

20. The storage device according to claim 19, wherein
the first voltage is higher when a location of the selected memory cell is far from the word line drive circuit than when the location of the selected memory cell is close to the word line drive circuit, and
the second voltage is lower when the location of the selected memory cell is far from the bit line drive circuit than when the location of the selected memory cell is close to the bit line drive circuit.

* * * * *